United States Patent
Hamparian

Patent Number: 6,091,279
Date of Patent: Jul. 18, 2000

[54] TEMPERATURE COMPENSATION OF LDMOS DEVICES

[75] Inventor: Simon Hamparian, Palisades Park, N.J.

[73] Assignee: Lucent Technologies, Inc., Murray Hill, N.J.

[21] Appl. No.: 09/058,826

[22] Filed: Apr. 13, 1998

[51] Int. Cl.[7] .................................................. H01L 35/00
[52] U.S. Cl. .......................................... 327/513; 327/543
[58] Field of Search ..................................... 327/512, 513, 327/538, 543, 560, 581; 323/315, 312, 313

[56] References Cited

U.S. PATENT DOCUMENTS

| | | | |
|---|---|---|---|
| 5,038,053 | 8/1991 | Djenguerian et al. | 327/513 |
| 5,081,380 | 1/1992 | Chen | 323/312 |
| 5,136,182 | 8/1992 | Fawal | 327/513 |
| 5,434,533 | 7/1995 | Furutani | 327/513 |
| 5,631,600 | 5/1997 | Akioka et al. | 327/513 |
| 5,744,999 | 4/1998 | Kim et al. | 323/315 |

*Primary Examiner*—Jung Ho Kim

[57] ABSTRACT

Temperature compensation of LDMOS devices as are employed in high power amplifiers follows from replacing the voltage source and resistive divider that feed the sensing diode of prior art temperature compensators for transistor amplifiers, with a current source feeding the sensing diode in a manner that is substantially independent of voltage variations which follow from temperature change. Such current variations as result from temperature change, in the circuit of the invention, produce variations in the bias voltage at the gate of the LDMOS power transistor which are many times less than the temperature coefficient of the LDMOS device, in producing virtually error-free temperature compensation.

7 Claims, 1 Drawing Sheet

TEMPERATURE COMPENSATION OF LDMOS DEVICES

FIELD OF THE INVENTION

This invention relates to semiconductor amplifier circuits, in general, and to such amplifier circuits incorporating Laterally Diffused Metal-Oxide Semiconductor (LDMOS) devices, in particular.

BACKGROUND OF THE INVENTION

LDMOS devices are finding increasing use in amplifier circuits—and, because of the high gain and linearity they exhibit, in power amplifier circuits, such as Class AB high power amplifiers. Testing as shown, however, that such LDMOS devices are very sensitive to bias voltages, to the extent that even as little as a 50 milli-volt change in the gate voltage could alter the drain current by as much as 30% or greater. For such reason, temperature compensation of these LDMOS devices has been found essential to offset the varying biasing voltages which follow from ambient temperature changes. This has been found particularly so with cellular telephone Base Station equipment at outside locations.

Testing has shown, though, that the typical method of providing temperature compensation of semiconductor amplifier devices leaves much to be desired. Analysis has revealed that this follows from the temperature compensation circuit's utilization of voltage dividers in which semiconductor diodes and/or thermistors are coupled across the input and control electrodes of the semiconductor device. Investigation has established that this results from the fact that the voltage source employed in such divider network is, itself, subject to temperature variation. For example, a nominal 5 volt supply has been determined to vary as much as 3% and more as temperatures rise, producing anywhere from a 0.5 to 1.0 millivolt per degree C. error. A fifty degree increase beyond room temperature could then produce a 50 millivolt increase in voltage, to such an extent as to significantly change the voltage divider bias on the LDMOS device, to drastically affect its performance, and because of its inherent gain and linearity. Thus, in these high power, LDMOS amplifier arrangements, something other than employing a voltage divider network for gate electrode temperature compensation is needed.

SUMMARY OF THE INVENTION

As will become clear from the following description, the preferred embodiment of the invention to be described follows from an analysis that shows that an "error-free" tracking circuit can be had for the LDMOS device by utilizing a current source to feed the sensing diode at its gate electrode, instead of using a voltage source with resistive dividers into the diode, as typified the prior art. (Such an analysis yielded comparable results for those prior art temperature compensation circuits that substituted thermistors for the sensing diode coupling to the gate electrode, where the voltage source continued to be used in a divider network—and, again, for the reason that the voltage source varied with temperature.) In accordance with a preferred embodiment to be described, the current source of the temperature compensation circuit is serially connected with a diode affording a forward voltage drop across the gate and source electrodes of the LDMOS device, although the prior art thermistor could be employed instead. A potentiometer is included in the series circuit connection for varying the magnitude of the current from the current source, while a fixed resistance is also included in series connection with the potentiometer in this preferred embodiment, between the current source and the forward voltage dropping diode, to limit the maximum current flow. In the preferred embodiment described below, a 3-terminal regulator is connected to serve as the current source—which is itself substantially temperature corrected, so as to exhibit a very small error in the bias voltage developed for the gate electrode, due to temperature variations. Component values are selected for the temperature compensation circuit so as to provide a negative temperature coefficiernt of substantially −2 millivolts/° C. at the gate electrode of the LDMOS device, to match and offset its own temperature characteristics.

While the preferred embodiment of the present invention will be described in connection with a particular LDMOS device having a 2 millivolt/° C. temperature offsetting characteristic as manufactured by Motorola, it will be understood by those skilled in the art that the teachings of the present invention would apply equally as well to other LDMOS devices from this manufacturer, and to other LDMOS devices from other manufacturers. As will be understood, this follows from the recognition of the benefits had by employing a current source to feed the sensing diode (or thermistor), as contrasted with the previously used voltage source with resistive dividers into the diode.

BRIEF DESCRIPTION OF THE DRAWING

These and other features of the present invention will be more clearly understood from a consideration of the following description, taken in connection with the accompanying drawing, in which.

DETAILED DESCRIPTION OF THE DRAWING

Figure 1:
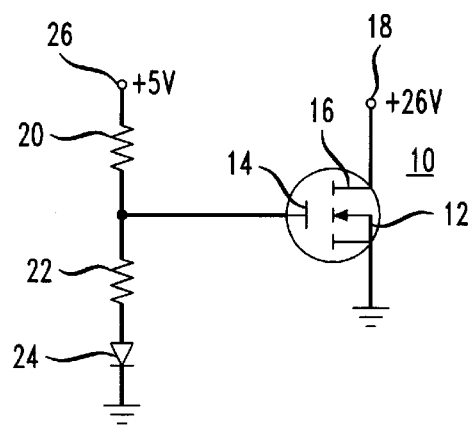
FIG. 1 illustrates the temperature compensation of an LDMOS device following the teachings of the prior art in utilizing a voltage source with a resistive divider network.

In the prior art temperature compensation circuit of FIG. 1, the LDMOS device 10 will be understood to comprise a power transistor having source, gate and drain electrodes 12, 14 and 16, respectively. With the source electrode 12 connected to ground, with the drain electrode connected to a supply voltage at 18 (typically +26 volts), the gate electrode 14 is coupled to a divider circuit including resistors 20, 22 and a diode 24, connected between a voltage source at 26 (typically +5 volts) and ground. As will be appreciated, with a ±2% variation over temperature at the +5 volt source, the 100 millivolt or so change at the biasing voltage at the gate electrode 14 could drastically vary the drain current of the LDMOS power transistor 10 significantly affecting its performance. With the LDMOS power transistor being of the PRF286 type as available from Motorola, there could result as much as a 30% or greater change in the drain current due to the inherent gain of the power transistor 10. To avoid this, the present invention essentially replaces the voltage source at 26, with a temperature stabilized current source 28 (FIG. 2), and more clearly illustrated by the reference numeral 30 in FIG. 3.

Figure 2:
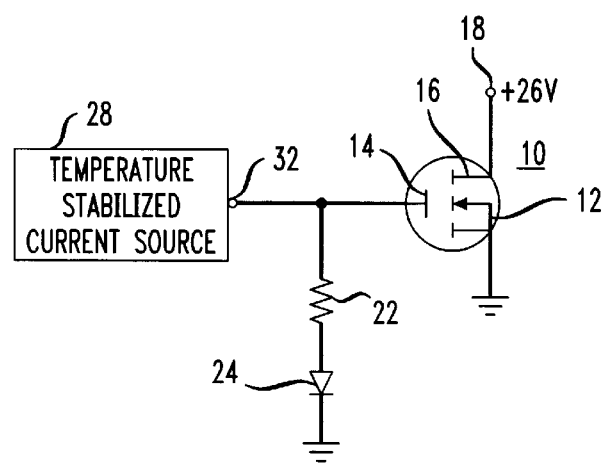
FIG. 2 schematically illustrates a temperature compensation circuit employing the temperature stabilized current source alternative of the present invention.
Figure 3:
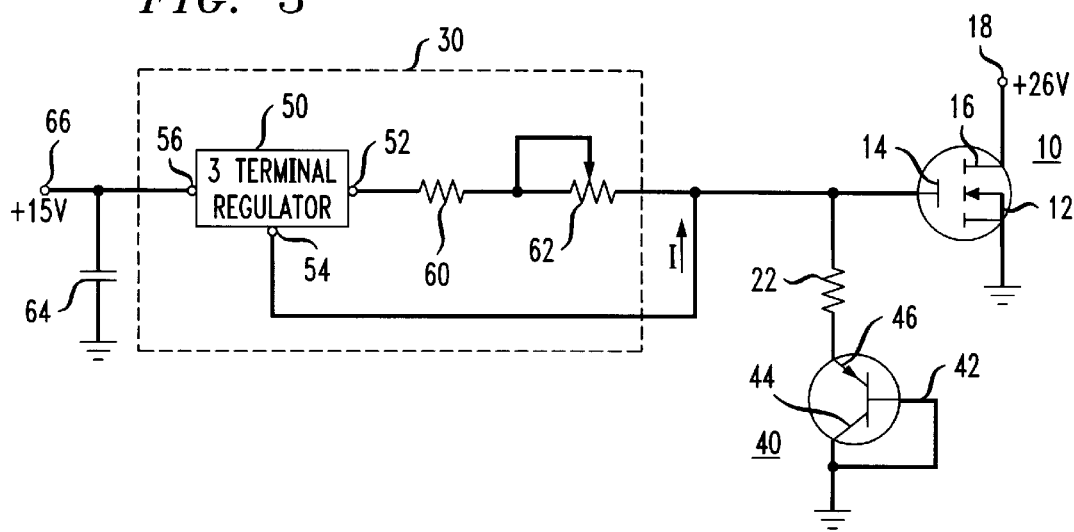
FIG. 3 is a simplified schematic diagram, partially in block diagram form helpful in an understanding of the teachings of the present invention.

More specifically, in FIG. 2, the gate electrode 14 of the LDMOS power transistor 10 is coupled to the junction of the resistor 22 and the output 32 of the current source 28, instead of to the junction between the resistors 20 and 22 of the prior art configuration of FIG. 1. In FIG. 3, a PNP transistor 40 is shown with its base and collector electrodes 42, 44 connected together and grounded, and with its emitter electrode 46 coupled to the resistor 22 in serving as the diode 24 of FIG. 2. (A Motorola MJE 171 transistor is illustrated as serving in this context.) The current source 30, on the other hand, employs a 3-terminal regulator 50 (such as is available from Motorola under its designation LM317LD), with its output terminal 52 serially connected to the gate electrode 14 by a fixed resistor 60 and a potentiometer 62, and with its adjust terminal 54 connected to the gate electrode 14 of the LDMOS power transistor, as well. A capacitor 64 couples the input terminal 56 of the 3-terminal regulator 50 to ground, with a +15 volt source connected at 66 to the input terminal 56. As will be appreciated to those skilled in the art, the LM317LD 3-terminal regulator 50 is oftentimes conventionally arranged this way in providing a current source, with an output reference voltage of +5 volts at its it terminal 52. With a bias voltage of +4 volts required at the gate electrode 14, the potentiometer 62 can be adjusted to vary the magnitude of the current from the regulator 50. The value of the fixed resistor 60 then limits the maximum current from the regulator 50 in the event the potentiometer 62 shorts out. Connecting the PNP transistor 40 as a diode in this manner allows the transistor to be mounted directly to a heat sink near the LDMOS power transistor 10.

As will thus be appreciated, the current source 30 is not thus voltage dependent. Therefore, in this manner, the potentiometer 62 is adjusted to set the current flow through resistor 22 in establishing the necessary bias voltage at the gate electrode 14—for example, +4 volts. The diode 24 (or the transistor 40) is selected of the same material as the LDMOS power transistor 10 so as to provide a matching temperature coefficient characteristic to offset the variations in drain current with temperature. With the active devices and voltages as specified, resistors 22 and 60 may be of 170 ohms and 39 ohms, respectively, and with a 100 ohm resistance for the potentiometer 62, in providing an output current of 20 milliamps.

With the 3-terminal regulator 50 connected in conventional manner in a current source mode 30, a reference voltage between the adjust terminal 54 and the output terminal 52 of 1.25 volts is developed in this preferred embodiment of using the Motorola LM317LD component. As this reference voltage is subject to change with temperature, the output current flowing through resistor 22 will change as well. Calculations have shown, however, that the change in bias voltage thus produced at the gate electrode 14 of the LDMOS power transistor 10 is only of the order of 0.18 millivolts/° C., many times less than the 2 millivolts/° C. temperature coefficient of the LDMOS device. For such reason, temperature changes with the current source of the invention produce very small errors in the overall temperature compensation of the LDMOS power transistor 10. The diode 24 of FIG. 2 (and the diode-connected transistor 40 FIG. 3) thus substantially tracks the temperature characteristics of the LDMOS power transistor 10 in providing the temperature compensation, independent of the voltage variations which oftentimes are produced through temperature changes.

In this manner, a new and improved way is had to temperature compensate LDMOS devices in amplifier configurations, and particularly in high power amplifier designs operating at such high frequencies as 2 Gigahertz. These advantages follow from the matching of, and substantially offsetting the temperature coefficients of the LDMOS devices employed—a and results in the provision of a temperature compensation circuit which is substantially error insensitive as temperatures increase over a range from 25° C. to 100° C. Also, at lower frequency operations, where MOS devices could be employed instead of the LDMOS device, similar error-free temperature compensation will be understood to follow from the described utilization of this current source substitution.

While there have been described what are considered to be preferred embodiments of the present invention, it will be readily apparent to those skilled in the art that modifications can be made without departing from the scope of the teachings herein of utilizing a virtually error-free current source to feed the sensing diode, rather than a voltage source with dividers that characterized the prior art. For at least such reason, therefore, resort should be had to the claims appended hereto for a true understanding of the scope of the invention.

I claim:

1. A temperature compensation circuit comprising a high power LDMOS device having source, gate and drain electrodes: a current source operative from a source of supply voltage which varies with temperature; and a semiconductor device in series circuit connection with said current source and connected to exhibit a forward voltage drop across the gate and source electrodes of said high power LDMOS device; with said current source providing a current substantially independent of supply voltage variation following from temperature change; and further comprising a potentiometer coupled with said current source for varying a magnitude of a current from said current source.

2. The temperature compensation circuit of claim 1 further comprising a fixed resistance in series connection with said potentiometer, and coupled between said current source and said semiconductor device.

3. The temperature compensation circuit of claim 1 wherein said current source includes a 3-terminal regulator connected in a current source configuration.

4. The temperature compensation circuit of claim 1, wherein said semiconductor device comprises a diode.

5. The temperature compensation circuit of claim 4 wherein the diode comprises a transistor having an emitter electrode coupled to said current source, and a base and a collector electrode connected together.

6. The temperature compensation circuit of claim 1, in which said semiconductor device is selected of material to exhibit variations in voltage drop across the gate and source electrodes of said LDMOS device as temperatures change to offset the variations in the drain current of said LDMOS device otherwise caused by said temperature changes.

7. The temperature compensation circuit of claim 6, in which said semiconductor device is selected to exhibit a variation of voltage drop across the gate and source electrodes of said LDMOS device as temperature changes of substantially −2 millivolts/° C.

* * * * *